US011824567B2

(12) United States Patent
Gong et al.

(10) Patent No.: US 11,824,567 B2
(45) Date of Patent: Nov. 21, 2023

(54) ADAPTIVE INLINE POLLING OF DATA COMPRESSION WITH HARDWARE ACCELERATOR

(71) Applicant: EMC IP Holding Company LLC, Hopkinton, MA (US)

(72) Inventors: Shuguang Gong, Beijing (CN); Colin Zou, San Jose, CA (US); Tao Chen, Beijing (CN)

(73) Assignee: EMC IP HOLDING COMPANY LLC, Hopkinton, MA (US)

( * ) Notice: Subject to any disclaimer, the term of this patent is extended or adjusted under 35 U.S.C. 154(b) by 455 days.

(21) Appl. No.: 17/184,796

(22) Filed: Feb. 25, 2021

(65) Prior Publication Data

US 2022/0271773 A1 Aug. 25, 2022

(51) Int. Cl.
*H03M 7/30* (2006.01)
*G06F 9/48* (2006.01)
*G06F 9/50* (2006.01)

(52) U.S. Cl.
CPC .............. *H03M 7/60* (2013.01); *G06F 9/485* (2013.01); *G06F 9/5027* (2013.01); *G06F 2209/509* (2013.01); *H03M 7/6017* (2013.01)

(58) Field of Classification Search
CPC ....... H03M 7/60; H03M 7/6017; G06F 9/485; G06F 2209/509; G06F 9/5027
See application file for complete search history.

(56) References Cited

U.S. PATENT DOCUMENTS

| 10,177,782 B2 * | 1/2019 | Satpathy | ............. H03M 7/6011 |
| 2021/0109759 A1 * | 4/2021 | Ugale | .................... G06F 9/544 |

* cited by examiner

*Primary Examiner* — Khai M Nguyen
(74) *Attorney, Agent, or Firm* — WOMBLE BOND DICKINSON (US) LLP

(57) ABSTRACT

A computer implemented method of data compression using a hardware accelerator includes submitting a request to compress or decompress a data segment using a compression or decompression thread. The method also includes compressing or decompressing the data segment using a hardware accelerator, and performing inline polling of the hardware accelerator to determine whether the hardware accelerator has completed compressing or decompressing the data segment. The inline polling and the compressing or decompressing are performed in a single thread. The method also includes submitting a wakeup command to a segment thread in response to determining that the hardware accelerator has completed compressing or decompressing the data segment.

20 Claims, 7 Drawing Sheets

ADAPTIVE INLINE POLLING OF DATA COMPRESSION WITH HARDWARE ACCELERATOR

FIELD OF THE INVENTION

Embodiments of the present invention relate generally to data compression and systems. More particularly, embodiments of the invention relate to adaptive inline polling of data compression with a hardware accelerator.

BACKGROUND

Notable portions of central processing unit (CPU) bandwidth are consumed by compression and decompression in storage systems. In many usage scenarios, such as backup, restore, and replication, system performance is bottlenecked by CPU bandwidth. In some scenarios, performance can be improved using a hardware accelerator.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Figure 1:
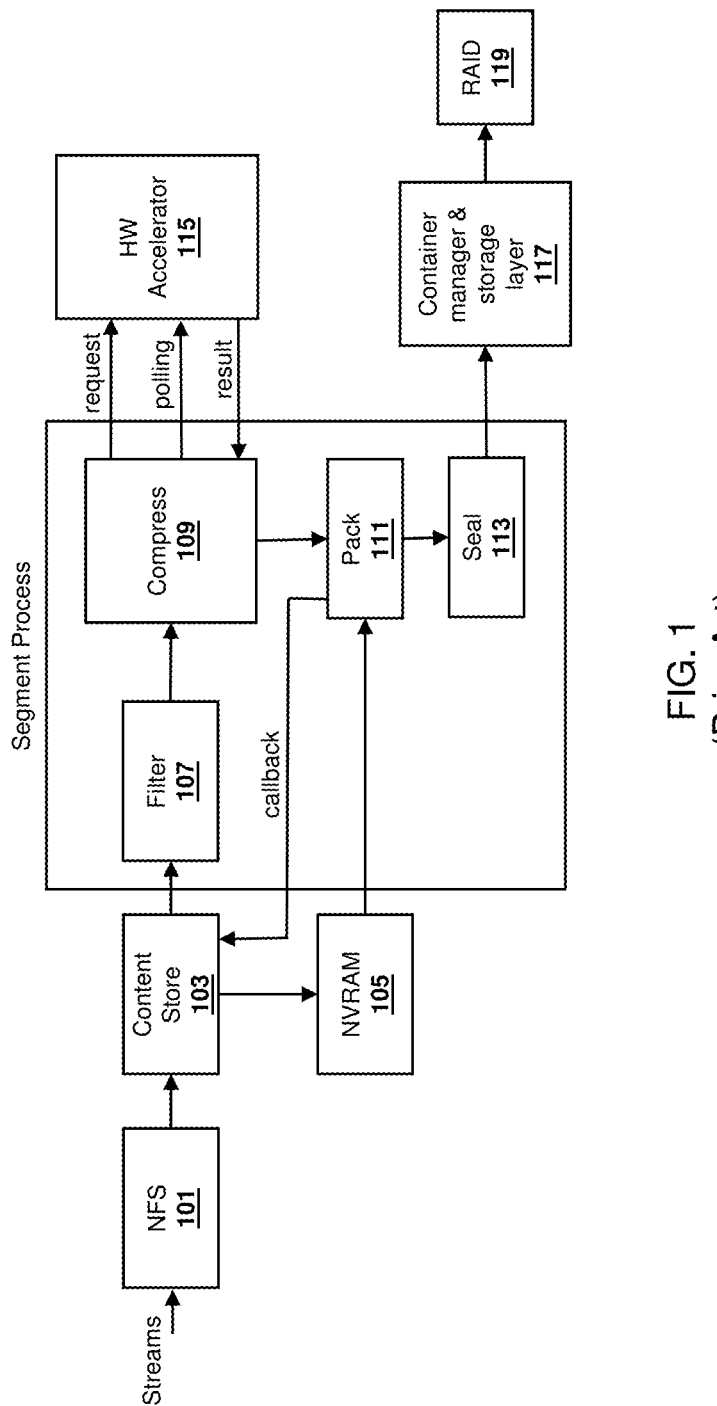
FIG. 1 is a block diagram illustrating a data compression method, according to the prior art.

Embodiments described herein disclose a computer implemented method of data compression using a hardware accelerator. The method includes A number of non-trivial technical challenges arise when incorporating a hardware accelerator, such as a QuickAssist Technology (QAT) hardware accelerator with a CPU. QAT is an efficient hardware-assisted technology used to enhance security and compression performance. It has been widely used in deduplication systems to improve compression performance and offload CPU costs. In order to achieve optimal performance of QAT, a variety of approaches have been designed to boost throughput, reduce CPU overhead, and reduce QAT response latency. In some scenarios it can be challenging to fetch data fast while keeping a high result poll hit ratio, and also keeping low CPU overhead. It is also very difficult to achieve low thread wakeup latency while a CPU is very busy and keep non-pre-emptible mode during compression.

According to an embodiment of the present disclosure, an adaptive QAT inline polling method is proposed. The methods disclosed herein can take into account data pattern characteristics, QAT computing performance, and CPU scheduling latency and reduce the QAT response latency and CPU offloading overhead. Such methods can also achieve more stable performance across different user workloads.

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

In the description of the embodiments provided herein, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other. Additionally, the terms "server," "client," and "device" are intended to refer generally to data processing systems rather than specifically to a particular form factor for the server, client, and/or device.

FIG. 1 is a block diagram illustrating a data compression method, according to the prior art. QAT polling methods and latency have a major impact on the overall performance of a deduplication system, especially when CPU and other resources are under great pressure. FIG. 1 shows a typical ingest workflow of a deduplication system. The system includes a network file system (NFS) 101, a content store 103, and NVRAM 105. In this embodiment, the segment process components include a filter 107, and modules configured to compress 109, pack 111, and seal 111 data. The HW accelerator 115 (such as QAT hardware) assists in the compression. According to this process, before packing the data at 111, the system waits for the completion of data compression. So the overall performance is closely associated with the response latency of the HW accelerator 115.

In the appliance stack of QAT, polling mode is used to process responses from the QAT hardware. The frequency of polling is a key performance parameter that has an impact on throughput, latency and offloading overhead. With higher polling frequency, CPU cycles would be wasted by invalid polling (no responses available), increasing offloading overhead. With lower polling frequency, QAT responding latency would increase, which would hurt the throughput. So, there is a demand for tuning the polling parameters based on the system situations at run-time.

Figure 2:
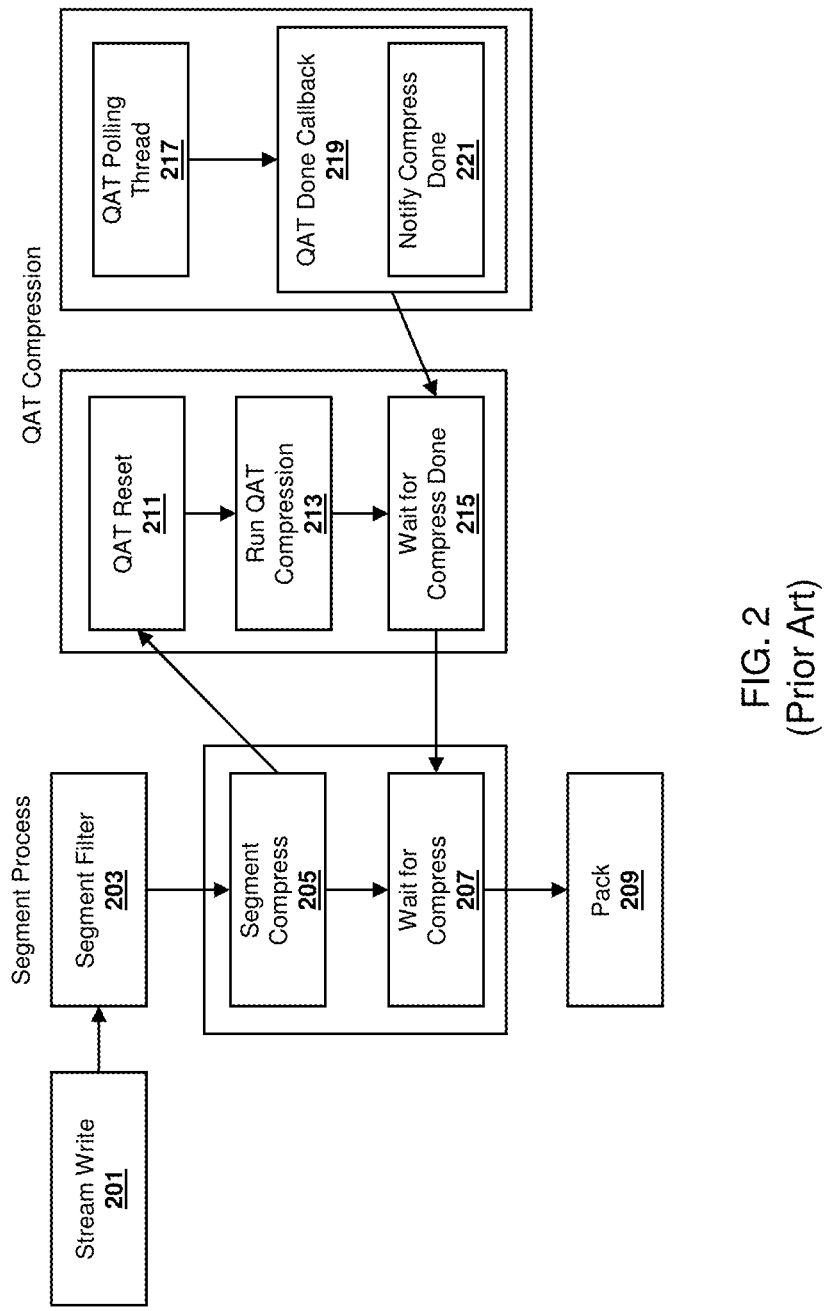
FIG. 2 is a block diagram illustrating another data compression method, according to the prior art.

FIG. 2 is a block diagram illustrating another data compression method, according to the prior art. In the method shown in FIG. 2, the process begins with stream write 201, and then proceeds to the segment process. In this method, the segment process includes a segment filter 203 and segment compress 205. Before packing 209, the segment process waits for the compression to complete 207. The QAT compression includes a QAT reset 211, running QAT compression, and waiting for the compression to be done 215.

A standalone polling thread is used to check for QAT compression responses periodically. That polling thread includes QAT polling thread 217, QAT done callback 219. Once the QAT compression is done, the polling thread notifies that the compression is done 221. This is called non-inline polling. To improve the real-time performance, the thread generally is designed as a real-time thread with highest scheduling priority. This allows for maximum throughput but has some disadvantages.

To improve throughput, the non-inline mode polling interval is configured statically to be a very short timeline. For example, in the DELL-EMC PowerEdge Dedup system, the interval is set to 20 us in a real-time polling thread. Actually, the workload of QAT can vary along with different situations. In the test on Juno-T3 with 256 streams and NFS protocol, the rate of polling success is only about 6%. So, most of CPU polling time is wasted. Data from that test is shown in Table 1.

TABLE 1

| Poll success times | Poll retry times | Poll success rate |
|---|---|---|
| 12434329 | 1778985036 | 6% |

When a CPU is overrun, the latency of context switching between the standalone polling thread and compression thread, which is represented by "poll2wakeup latency" is increasing. In some cases, the latency can increase drastically, dealing blow to the de-dup performance. Table 2 shows a test result in a DDBoost test on Juno-T4. In the worst case, the poll2wakeup latency can decrease 30% performance of QAT.

TABLE 2

| | CPU idle | Throughput of QAT (MB/s) | Poll2wakeup latency (us) | Poll2wakeup decomp (us) | Comp latency (us) | Decomp latency (us) |
|---|---|---|---|---|---|---|
| Gen0 | 5% | 4432 | 246 | 198 | 829 | 584 |
| Gen42 | 2% | 16427 | 693 | 356 | 1676 | 918 |

System Overview

To address the issues associated with non-inline polling, an adaptive inline polling method is disclosed. In one embodiment, inline polling is deployed to reduce latency introduced by context switching between polling and compression threads. In contrast to former techniques, the inline polling action is triggered in place in the compression thread context after submitting new requests.

Figure 3:
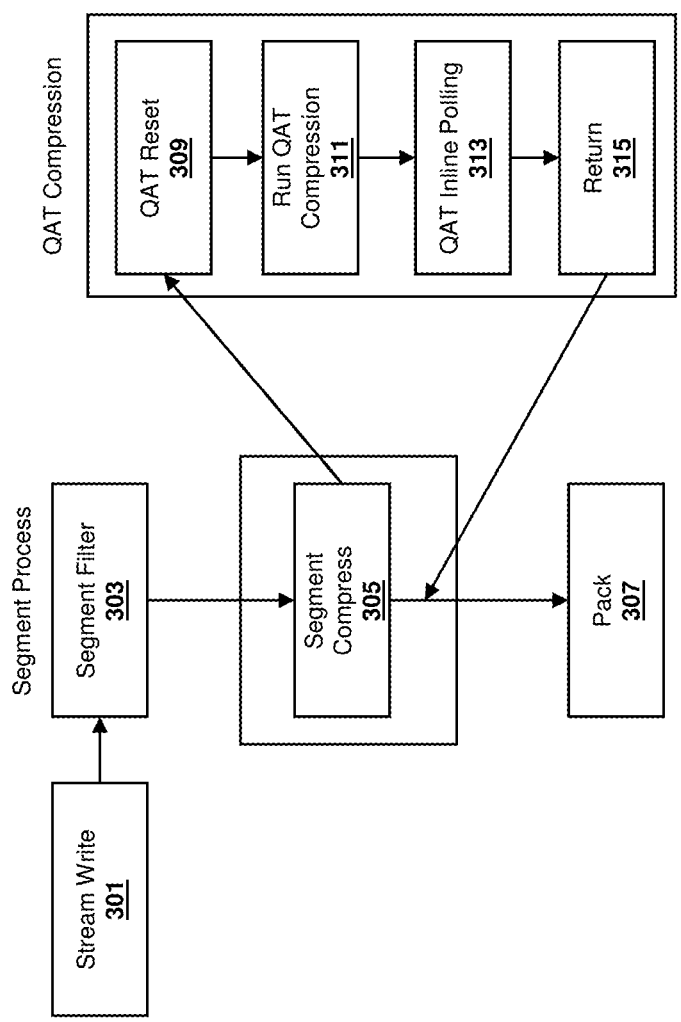
FIG. 3 is a block diagram illustrating a data compression method, according to an embodiment of the present disclosure.

FIG. 3 is a block diagram illustrating a data compression method, according to an embodiment of the present disclosure.

In the method shown in FIG. 3, the process begins with stream write 301, and then proceeds to the segment process. In this method, the segment process includes a segment filter 303 and segment compress 305. Before packing 307, the QAT compression thread, which includes QAT inline polling 313, is deployed. The QAT compression includes QAT reset 309, running QAT compression 311, QAT inline polling 313, and return 315 for when the inline polling indicates that compression has completed.

As mentioned above, in non-inline mode where an independent polling thread is used, the compression thread is blocked after submitting a request to the hardware accelerator, until being resumed by the polling thread. In this case, a context switch latency is introduced, which is what "poll2wakeup" indicates in Table 2. By contrast, in inline polling mode the polling routine works in the same thread as compression, cutting off the context switch overhead. This inline polling approach often leads to optimal performance since the frequency of polling can be easily adjusted to match that of submission.

A size-ware polling policy can be used to adjust the polling interval dynamically. By using it, the polling interval can adapt to the varying data size, workload, and compression level. Adaptive size-aware polling makes it possible to optimize polling at run-time on a workload specific basis.

TABLE 3

| | Packet size (KB) | | | | |
|---|---|---|---|---|---|
| Compression Level | 8 | 16 | 32 | 64 | 128 |
| Dynamic Level 1 Latency (us) | 40 | 67 | 109 | 187 | 336 |
| Dynamic Level 2 Latency (us) | 54 | 105 | 176 | 291 | 638 |
| Dynamic Level 3 Latency (us) | 63 | 130 | 216 | 354 | 829 |
| Dynamic Level 4 Latency (us) | 77 | 167 | 274 | 441 | 1158 |

Table 3 shows the compression latency with one Intel Skylake-SP 6152 processor and one QAT C627 Chipset. In the test results illustrated in Table 3, with compression level 1 on DELL-EMC Dedup system, it shows similar results as shown in Table 4 below. In some embodiments, the compression latency can be predicted more accurately, and the polling interval can be set according to compression data size.

TABLE 4

| Data Size (KB) | Latency (us) |
|---|---|
| 128 | 327.28 |
| 96 | 256.21 |
| 64 | 188.91 |
| 32 | 118.05 |
| 16 | 85.44 |

Platform: Juno T3
QAT polling interval: 20 us
Compression Level: 1

In some embodiments, a latency prediction method can be used to calculate the context switch latency and help to adjust the polling interval further. This can achieve more accurate and efficient polling control. The real polling interval can be generally calculated by equation (1) below:

$$\text{Real Polling Interval} = \text{Polling Interval} + \text{Context Switch Latency} \quad (1)$$

In some embodiments, there can be multiple compression threads running in parallel. To reduce the CPU overhead, the compression threads are not working as real-time threads, so the context switch latency is not always constant. Generally, the latency can range from 50 us to 300 us, in some embodiments. It can vastly impact the polling interval, leading to inefficient polling. So, it's important to predict the context switch latency before starting polling.

In some embodiments, the latency can be estimated with a mean calculation method. In a short period of time, for a set of relatively stable workloads, the average QAT latency can be seen as consistent. In the present disclosure, a Latency Prediction Window (LPW) is introduced to facilitate the estimation of context switch latency. The LPW value is a sample number of Context Switch in previous inline polling in a short duration. In one embodiment, the mean context switch latency (CSL) can be calculated according to equation (2) below:

$$\text{Mean CSL} = \Sigma_{i=1}^{LPW} CSL_i / LPW \quad (2)$$

In some embodiments, polling threads can be dynamically promoted to real-time threads in order to achieve optimized latency where QAT responses are expected to be retrieved in a very short time. This could happen after a long polling miss with a data-size-ware polling policy. In some embodiments, the outnumbered real-time threads in a system would have a negative effect on performance. Thus, this technique is supposed to be used in a sophisticated manner.

Figure 4:
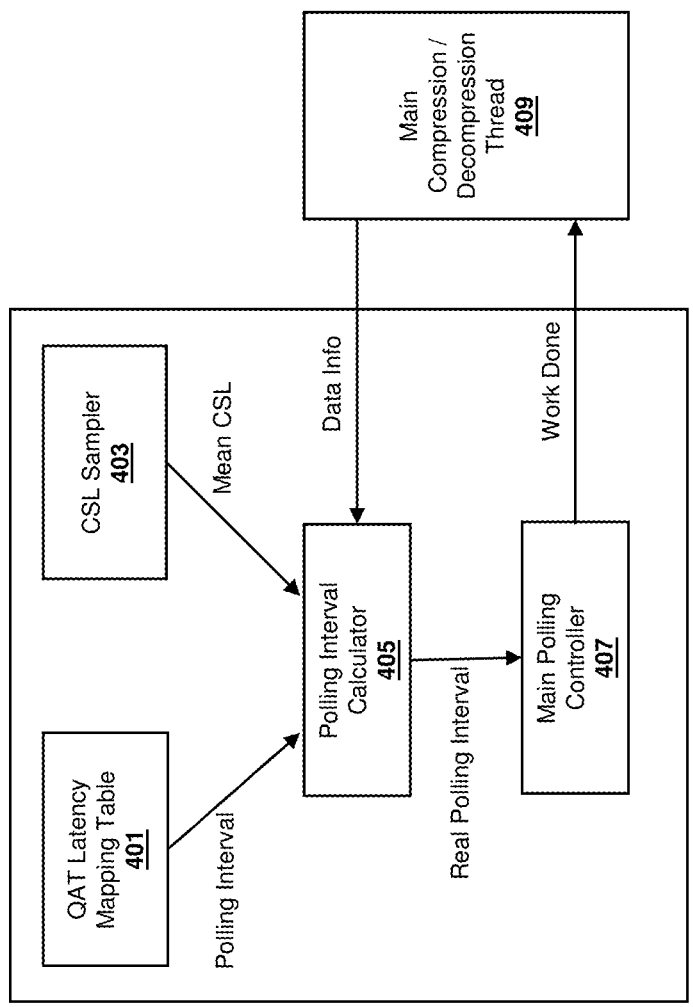
FIG. 4 is another block diagram illustrating an adaptive inline polling method, according to an embodiment of the present disclosure.

FIG. 4 is another block diagram illustrating an adaptive inline polling method, according to an embodiment of the present disclosure. The QAT latency mapping table 401 is used to store the compress/decompress latency of different data sizes. This table can be generated by performance testing or derived from official performance benchmarks. The CSL sampler 403 is used to sample the context switch latency in the last recent polling and calculate the mean latency. The information in both above modules will be used by polling interval calculator 405 to calculate the real polling interval. The main polling controller 407 can handle the main workflow of inline polling, and the main compression/decompression thread 409 can perform the compression and decompression functions.

Figure 5:
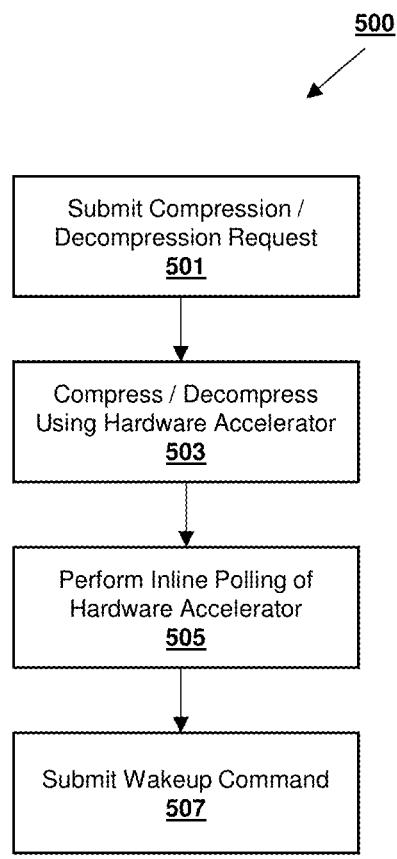
FIG. 5 is a flow diagram of an example data compression process utilizing inline polling, according to an embodiment of the present disclosure.

FIG. 5 is a flow diagram of an example data compression process 500 utilizing inline polling, according to an embodiment of the present disclosure. The data compression process 500 can be executed, for example, by the data compression module systems shown in FIGS. 3-4.

In operation 501, a compression or decompression request for a data segment is submitted. At operation 503, the compression or decompression is performed using the hardware accelerator.

At operation 505, inline polling of the hardware accelerator is performed to determine whether the hardware accelerator has completed compressing or decompressing the data segment. In this embodiment, the inline polling and the compressing or decompressing are performed in a single thread.

In some embodiments, the inline polling of the hardware accelerator is performed at a polling interval based on a size of the data segment being compressed or decompressed. The polling interval can be calculated based on the size of the data segment being compressed or decompressed, and a known time at which the request to compress or decompress data is submitted.

In some embodiments, a mean contact switch latency based on previous contact switch latencies of previous compression or decompression actions can be calculated dynamically. A dynamic polling interval can also be calculated based on a difference between the polling interval calculated based on the size of the data segment and the mean contact switch latency.

Figure 6:
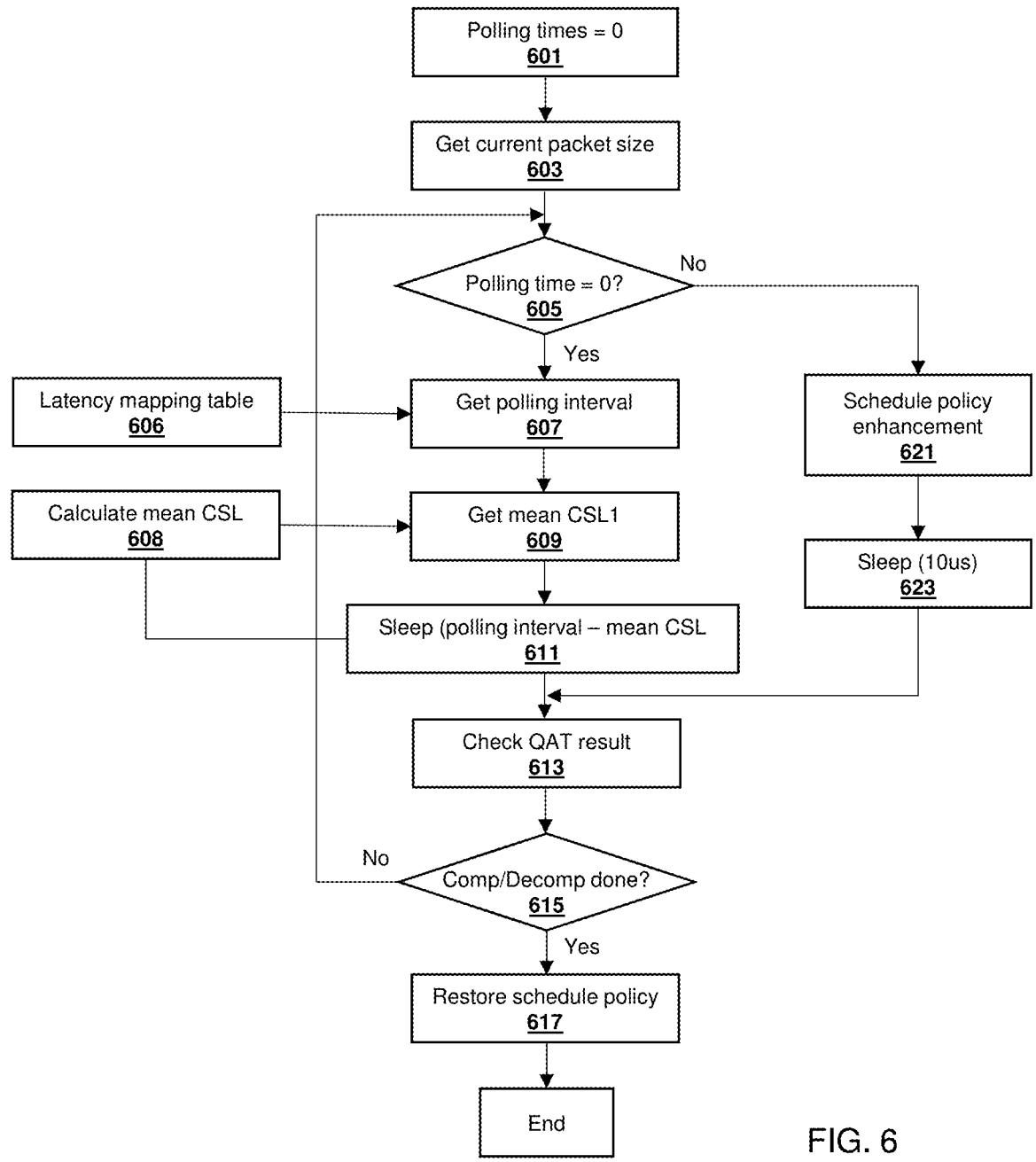
FIG. 6 is a flow diagram of another example data compression process utilizing inline polling, according to an embodiment of the present disclosure.

FIG. 6 is a flow diagram of another example data compression process 600 utilizing inline polling, according to an embodiment of the present disclosure. The data compression process 600 can be executed, for example, by the data compression module systems shown in FIGS. 3-4.

In operation 601, the process 600 begins when the number of polling times=0. At operation 603, the current data packet size is retrieved. If it is determined at 605 that the polling time is zero, the process 600 continues with getting the polling interval 607. In some embodiments, the polling interval can be determined based on the data packet size using the latency mapping table 606.

Because the same thread is used for compression/decompression and polling, it is known exactly when the QAT hardware request is sent (Run QAT hardware compression block). The packet size is also known from operation 603. Therefore, based on the exact timing of when the compression request is sent, combined with the packet size, a more accurate inline polling time can be generated. Table 3, above, was used to determine the inline polling interval for a particular example using a specific processor and chipset. In one example embodiment, if the packet size of 64 at level 1 predicts 187 us, it may be desirable to schedule the polling for 200 us in order to hopefully avoid missing when the poll is sent.

In addition to using size-aware polling, the systems and methods disclosed herein can also do dynamic latency prediction. Equation (2) calculates the mean contact switch latency (CSL) based on the latency prediction window (LPW).

Once the polling interval is determined, the process 600 continues with getting the mean CSL1 609. As discussed above, the mean CSL can be calculated 608 according to equation (2). In this embodiment, the process 600 continues with sleeping 611 for a period of time equal to the polling interval minus the mean CSL. After sleeping 611, the process 600 continues with checking the QAT result 613. If the compression or decompression is complete at 615, the process 600 continues with restoring the schedule policy 617 and ending the process. If the compression or decompression has not completed at 615, the process 600 returns and performs prioritized or accelerated polling at operations 621 and 623. In some embodiments, prioritized inline polling of the hardware accelerator can be performed at a shortened polling interval in response to determining that the hardware accelerator has not completed compressing or decompressing the data segment. The shortened polling interval can be, for example, between about 10 and 30 microseconds.

Figure 7:
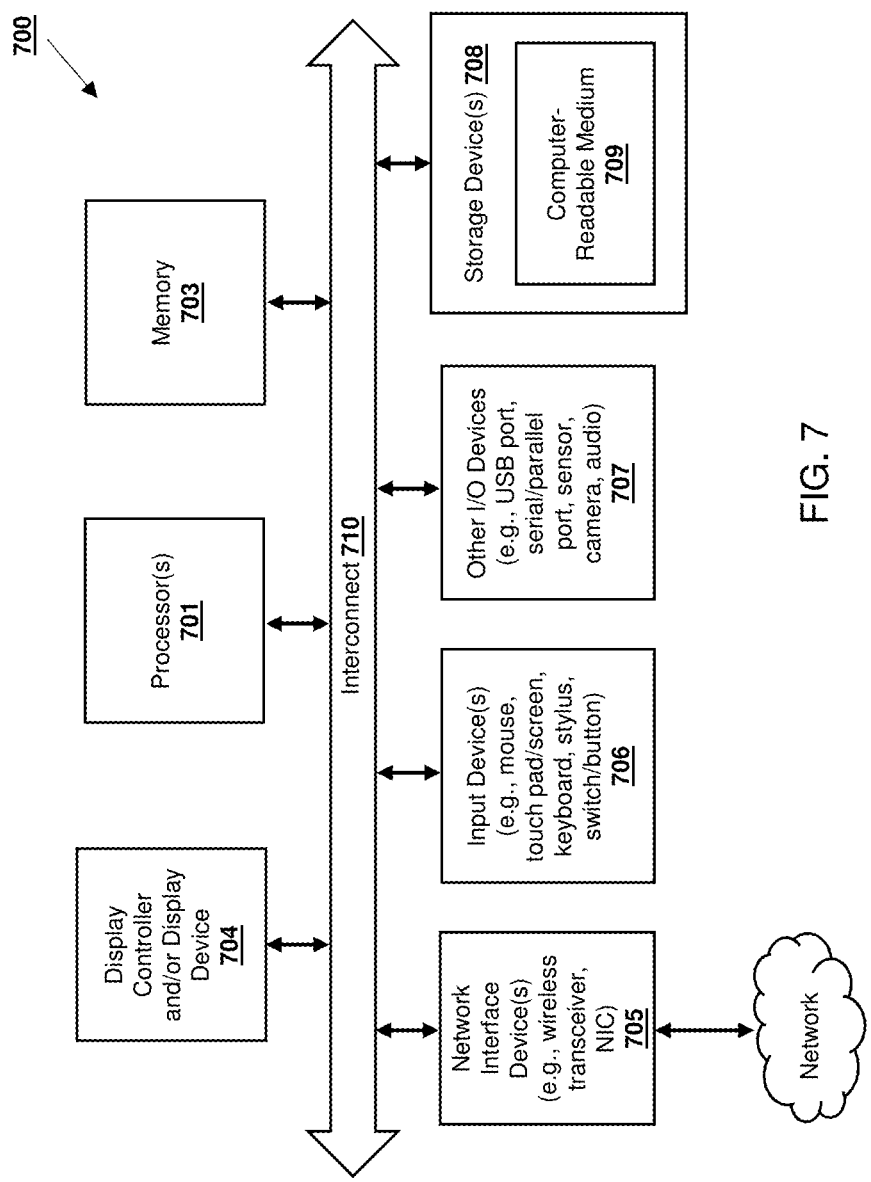
FIG. 7 is a block diagram illustrating an example of a data processing system that may be used with embodiments described herein.

FIG. 7 is a block diagram illustrating an example of a data processing system 700 that may be used with embodiments described herein. The data processing system 700 may represent any of the data processing systems described above and may perform any of the processes or methods described above. The data processing system 700 can include many different components. These components can be implemented as integrated circuits (ICs), discrete electronic devices, or other modules adapted to a circuit board such as a motherboard or add-in card of the computer system, or as components otherwise incorporated within a chassis of the computer system. Note also that the data processing system 700 is intended to show a high-level view of many components of the computer system. However, it is to be understood that additional components may be present in certain implementations and furthermore, different arrangement of the components shown may occur in other implementations. The data processing system 700 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment the data processing system 700 includes one or more processor(s) 701, memory 703, network interface devices, 705, I/O devices, 706, 707 and storage device(s) 708 connected via a bus or an interconnect 710. The one or more processor(s) 701 may be a single processor or multiple processors with a single processor core or multiple processor cores included therein. The processor(s) 701 may represent one or more general-purpose processors such as a microprocessor, a central processing unit (CPU), or the like. More particularly, the processor(s) 701 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. The processor(s) 701 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

The processor(s) 701 may be a low power multi-core processor, such as an ultra-low voltage processor, and may act as a main processing unit and central hub for communication with the various components of the system. Such processor can be implemented as a system on chip (SoC). The processor(s) 701 are configured to execute instructions for performing the operations and steps discussed herein. The data processing system 700 may further include a graphics/display subsystem 704, which may include a display controller, a graphics processor, and/or a display device. In one embodiment at least a portion of the graphics/display subsystem 704 is integrated into the processors(s) 701. The graphics/display subsystem 704 is optional and some embodiments may not include one or more components of the graphics/display subsystem 704.

The processor(s) 701 communicates with memory 703, which in one embodiment can be implemented via multiple memory devices to provide for a given amount of system memory. The memory 703 may include one or more volatile storage (or memory) devices such as random access memory (RAM), dynamic RAM (DRAM), synchronous DRAM (SDRAM), static RAM (SRAM), or other types of storage devices. The memory 703 may store information including sequences of instructions that are executed by the one or more processor(s) 701 or any other device. For example, executable code and/or data of a variety of operating systems, device drivers, firmware (e.g., input output basic system or BIOS), and/or applications can be loaded in the memory 703 and executed by one of the processor(s) 701. The operating system can be any kind of operating system such as, for example, Windows® operating system from Microsoft®, Mac OS®/iOS® from Apple, Android® from Google®, Linux®, Unix®, or other real-time or embedded operating systems such as VxWorks.

The data processing system 700 may further include I/O devices such as a network interface device(s) 705, input device(s) 706, and other I/O device(s) 707. Some of the input device(s) 706 and other I/O device(s) 707 may be optional and are excluded in some embodiments. The network interface device(s) 705 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

The input device(s) 706 may include a mouse, a touch pad, a touch sensitive screen (which may be integrated with a display device of the graphics/display subsystem 704), a pointer device such as a stylus, and/or a keyboard (e.g., physical keyboard or a virtual keyboard displayed as part of a touch sensitive screen). For example, the input device(s) 706 may include a touch screen controller coupled to a touch screen. The touch screen and touch screen controller can, for example, detect contact and movement or a break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

The other I/O device(s) 707 may also include an audio device. An audio device may include a speaker and/or a microphone to facilitate voice-enabled functions, such as voice recognition, voice replication, digital recording, and/or telephony functions. The other I/O device(s) 707 may also include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. The other I/O device(s) 707 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 710 via a sensor hub (not shown), while other devices such as a keyboard or thermal sensor may be controlled by an embedded controller (not shown), dependent upon the specific configuration or design of data processing system 700.

To provide for persistent storage of information such as data, applications, one or more operating systems and so forth, a mass storage (not shown) may also couple to the processor(s) 801. In various embodiments, to enable a thinner and lighter system design as well as to improve system responsiveness, this mass storage may be implemented via a solid state device (SSD). However, in other embodiments the mass storage may primarily be implemented using a hard disk drive (HDD) with a smaller amount of flash based storage to act as an SSD cache to enable non-volatile storage of context state and other such information during power down events so that a fast power up can occur on re-initiation of system activities. In addition, a flash device may be coupled to the processor(s) 801, e.g., via a serial peripheral interface (SPI). This flash device may provide for non-volatile storage of system software, including a basic input/output software (BIOS) as well as other firmware of the system.

The storage device(s) 708 may include computer-readable storage medium 709 (also known as a machine-readable storage medium) on which is stored one or more sets of instructions or software embodying any one or more of the methodologies or functions described herein. The computer-readable storage medium 709 may also be used to store the same software functionalities described above persistently. While the computer-readable storage medium 709 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies of the present invention. The term "computer-readable storage medium" shall accordingly be taken to include, but not be limited to, solid-state memories, and optical and magnetic media, or any other non-transitory machine-readable medium.

Note that while the data processing system 700 is illustrated with various components of a data processing system, it is not intended to represent any particular architecture or manner of interconnecting the components; as such, details are not germane to embodiments of the present invention. It will also be appreciated that network computers, handheld computers, mobile phones, servers, and/or other data processing systems, which have fewer components or perhaps more components, may also be used with embodiments of the invention.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments of the invention also relate to an apparatus for performing the operations herein. Such a computer program is stored in a non-transitory computer readable medium. A machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially. Embodiments described herein are not described with reference to any particular programming language. It will be appreciated that a variety of programming languages may be used to implement the teachings of embodiments of the invention as described herein.

The following clauses and/or examples pertain to specific embodiments or examples thereof. Specifics in the examples may be used anywhere in one or more embodiments. The various features of the different embodiments or examples may be variously combined with some features included and others excluded to suit a variety of different applications. Examples may include subject matter such as a method, means for performing acts of the method, at least one machine-readable medium including instructions that, when performed by a machine cause the machine to performs acts of the method, or of an apparatus or system according to embodiments and examples described herein. Various components can be a means for performing the operations or functions described.

One embodiment provides for a computer implemented method of data compression using a hardware accelerator. The method includes submitting a request to compress or decompress a data segment using a compression or decompression thread, and compressing or decompressing the data segment using a hardware accelerator. The method also includes performing inline polling of the hardware accelerator to determine whether the hardware accelerator has completed compressing or decompressing the data segment. The inline polling and the compressing or decompressing are performed in a single thread. The method also includes submitting a wakeup command to a segment thread in response to determining that the hardware accelerator has completed compressing or decompressing the data segment. In one embodiment, the inline polling of the hardware accelerator is performed at a polling interval based on a size of the data segment being compressed or decompressed. In one embodiment, the method also includes calculating the polling interval based on the size of the data segment being compressed or decompressed, and a known time at which the request to compress or decompress data is submitted. In one embodiment, the method also includes dynamically calculating a mean contact switch latency based on previous contact switch latencies of previous compression or decompression actions. In one embodiment, the method also includes calculating a dynamic polling interval based on a difference between the polling interval calculated based on the size of the data segment and the mean contact switch latency. In one embodiment, the method also includes performing prioritized inline polling of the hardware accelerator at a shortened polling interval in response to determining that the hardware accelerator has not completed compressing or decompressing the data segment. In one embodiment, the shortened polling interval is between about 10 and 30 microseconds.

According to another aspect, the present disclosure relates to a data compression system including one or more processing devices, a hardware accelerator for compressing and decompressing data, and data compression logic to compress data via the one or more processing devices. The data compression logic is configured to submit a request to compress or decompress a data segment using a compression or decompression thread, and compress or decompress the data segment using the hardware accelerator. The logic is also configured to perform inline polling of the hardware accelerator to determine whether the hardware accelerator has completed compressing or decompressing the data segment. The inline polling and the compressing or decompressing are performed in a single thread. The logic is also configured to submit a wakeup command to a segment thread in response to determining that the hardware accelerator has completed compressing or decompressing the data segment. In one embodiment, the inline polling of the hardware accelerator is performed at a polling interval based on a size of the data segment being compressed or decompressed. In one embodiment, the data compression logic is also configured to calculate the polling interval based on the size of the data segment being compressed or decompressed, and a known time at which the request to compress or decompress data is submitted. In one embodiment, the data compression logic is also configured to dynamically calculate a mean contact switch latency based on previous contact switch latencies of previous compression or decompression actions. In one embodiment, the data compression logic is also configured to calculate a dynamic polling interval based on a difference between the polling interval calculated based on the size of the data segment and the mean contact switch latency. In one embodiment, the data compression logic is also configured to perform prioritized inline polling of the hardware accelerator at a shortened polling interval in response to determining that the hardware accelerator has not completed compressing or decompressing the data segment. In one embodiment, the shortened polling interval is between about 10 and 30 microseconds.

According to another aspect, the present disclosure relates to a non-transitory computer-readable medium storing instructions which, when executed by one or more processors, cause the one or more processors to perform a data compression operation. The data compression operation includes submitting a request to compress or decompress a data segment using a compression or decompression thread, and compressing or decompressing the data segment using the hardware accelerator. The compression operation also includes performing inline polling of the hardware accelerator to determine whether the hardware accelerator has completed compressing or decompressing the data segment. The inline polling and the compressing or decompressing are performed in a single thread. The compression operation also includes submitting a wakeup command to a segment thread in response to determining that the hardware accelerator has completed compressing or decompressing the data segment. In one embodiment, the inline polling of the hardware accelerator is performed at a polling interval based on a size of the data segment being compressed or decompressed. In one embodiment, the operation also includes calculating the polling interval based on the size of the data segment being compressed or decompressed, and a known time at which the request to compress or decompress data is submitted. In one embodiment, the operation also includes dynamically calculating a mean contact switch latency based on previous contact switch latencies of previous compression or decompression actions. In one embodiment, the operation also includes calculating a dynamic polling interval based on a difference between the polling interval calculated based on the size of the data segment and the mean contact switch latency. In one embodiment, the operation also includes performing prioritized inline polling of the hardware accelerator at a shortened polling interval in response to determining that the hardware accelerator has not completed compressing or decompressing the data segment.

In the foregoing specification, the invention has been described with reference to specific embodiments thereof. However, various modifications and changes can be made thereto without departing from the broader spirit and scope of the invention. The specification and drawings are, accordingly, to be regarded in an illustrative rather than a restrictive sense.

What is claimed is:

1. A computer implemented method of data compression using a hardware accelerator, the method comprising:
    submitting a request to compress or decompress a data segment using a compression or decompression thread;
    compressing or decompressing the data segment using a hardware accelerator;
    performing inline polling of the hardware accelerator to determine whether the hardware accelerator has completed compressing or decompressing the data segment, the inline polling and the compressing or decompressing being performed in a single thread; and
    submitting a wakeup command to a segment thread in response to determining that the hardware accelerator has completed compressing or decompressing the data segment.

2. The computer implemented method as in claim 1, wherein the inline polling of the hardware accelerator is performed at a polling interval based on a size of the data segment being compressed or decompressed.

3. The computer implemented method as in claim 2, further comprising:
    calculating the polling interval based on the size of the data segment being compressed or decompressed, and a known time at which the request to compress or decompress data is submitted.

4. The computer implemented method as in claim 2, further comprising:
    dynamically calculating a mean contact switch latency based on previous contact switch latencies of previous compression or decompression actions.

5. The computer implemented method as in claim 4, further comprising:
    calculating a dynamic polling interval based on a difference between the polling interval calculated based on the size of the data segment and the mean contact switch latency.

6. The computer implemented method as in claim 1, further comprising:
    performing prioritized inline polling of the hardware accelerator at a shortened polling interval in response to determining that the hardware accelerator has not completed compressing or decompressing the data segment.

7. The computer implemented method as in claim 6, wherein the shortened polling interval is between about 10 and 30 microseconds.

8. A data compression system comprising:
    one or more processing devices;
    a hardware accelerator for compressing and decompressing data; and data compression logic to compress data via the one or more processing devices, the data compression logic configured to:
  submitting a request to compress or decompress a data segment using a compression or decompression thread;
  compressing or decompressing the data segment using the hardware accelerator;
  performing inline polling of the hardware accelerator to determine whether the hardware accelerator has completed compressing or decompressing the data segment, the inline polling and the compressing or decompressing being performed in a single thread; and
  submitting a wakeup command to a segment thread in response to determining that the hardware accelerator has completed compressing or decompressing the data segment.

9. The data compression system as in claim 8, wherein the inline polling of the hardware accelerator is performed at a polling interval based on a size of the data segment being compressed or decompressed.

10. The data compression system as in claim 9, wherein the data compression logic is further configured to:
  calculate the polling interval based on the size of the data segment being compressed or decompressed, and a known time at which the request to compress or decompress data is submitted.

11. The data compression system as in claim 9, wherein the data compression logic is further configured to:
  dynamically calculate a mean contact switch latency based on previous contact switch latencies of previous compression or decompression actions.

12. The data compression system as in claim 11, wherein the data compression logic is further configured to:
  calculate a dynamic polling interval based on a difference between the polling interval calculated based on the size of the data segment and the mean contact switch latency.

13. The data compression system as in claim 8, wherein the data compression logic is further configured to:
  perform prioritized inline polling of the hardware accelerator at a shortened polling interval in response to determining that the hardware accelerator has not completed compressing or decompressing the data segment.

14. The data compression system as in claim 13, wherein the shortened polling interval is between about 10 and 30 microseconds.

15. A non-transitory computer-readable medium storing instructions which, when executed by one or more processors, cause the one or more processors to perform a data compression operation, the operation comprising:
  submitting a request to compress or decompress a data segment using a compression or decompression thread;
  compressing or decompressing the data segment using the hardware accelerator;
  performing inline polling of the hardware accelerator to determine whether the hardware accelerator has completed compressing or decompressing the data segment, the inline polling and the compressing or decompressing being performed in a single thread; and
  submitting a wakeup command to a segment thread in response to determining that the hardware accelerator has completed compressing or decompressing the data segment.

16. The non-transitory computer-readable medium as in claim 15, wherein the inline polling of the hardware accelerator is performed at a polling interval based on a size of the data segment being compressed or decompressed.

17. The non-transitory computer-readable medium as in claim 16, the operation further comprising:
  calculating the polling interval based on the size of the data segment being compressed or decompressed, and a known time at which the request to compress or decompress data is submitted.

18. The non-transitory computer-readable medium as in claim 16, the operation further comprising:
  dynamically calculating a mean contact switch latency based on previous contact switch latencies of previous compression or decompression actions.

19. The non-transitory computer-readable medium as in claim 18, the operation further comprising:
  calculating a dynamic polling interval based on a difference between the polling interval calculated based on the size of the data segment and the mean contact switch latency.

20. The non-transitory computer-readable medium as in claim 15, the operation further comprising:
  performing prioritized inline polling of the hardware accelerator at a shortened polling interval in response to determining that the hardware accelerator has not completed compressing or decompressing the data segment.

* * * * *